United States Patent
Ichikawa

(10) Patent No.: US 7,544,464 B2
(45) Date of Patent: Jun. 9, 2009

(54) MANUFACTURING METHOD OF TUNING-FORK TYPE QUARTZ CRYSTAL RESONATOR

(75) Inventor: Ryoichi Ichikawa, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 11/907,263

(22) Filed: Oct. 10, 2007

(65) Prior Publication Data

US 2008/0088384 A1    Apr. 17, 2008

(30) Foreign Application Priority Data

Oct. 10, 2006 (JP) ............... P.2006-276388

(51) Int. Cl.
*H03H 3/02* (2006.01)
*H03B 5/32* (2006.01)

(52) U.S. Cl. ............... 430/319; 430/320; 430/945; 219/121.69; 29/25.35

(58) Field of Classification Search ............... None
See application file for complete search history.

(56) References Cited

U.S. PATENT DOCUMENTS 4,080,696 A * 3/1978 Shimatsu ............... 29/25.35
5,522,249 A * 6/1996 Macy ............... 73/1.37
2005/0115038 A1 * 6/2005 Umetsu et al. ............... 29/25.35

FOREIGN PATENT DOCUMENTS

| JP | H08-139337 | 5/1996 |
| JP | 2001-085963 | 3/2001 |
| JP | 2003-133875 | 5/2003 |
| JP | 2005-134364 | 5/2005 |

\* cited by examiner

*Primary Examiner*—John A. McPherson
(74) *Attorney, Agent, or Firm*—Jacobson Holman PLLC

(57) ABSTRACT

There is disclosed a manufacturing method of a tuning-fork type quartz crystal resonator, in which a simple step can just be added to the existing manufacturing process to prevent generation of short-circuit at a crotch portion and largely improve yield. On a quartz crystal wafer, a metal film is formed on a quartz crystal substrate processed into a tuning-fork form by evaporation or sputtering, the metal film is patterned into desired electrode and wiring line shapes by photolithography/etching, and then a crotch portion 30 is irradiated with laser from a direction substantially vertical to a wafer surface to remove a non-etched metal film portion in the manufacturing method of the tuning-fork type quartz crystal resonator.

16 Claims, 4 Drawing Sheets

IRRADIATED WITH LASER

MANUFACTURING METHOD OF TUNING-FORK TYPE QUARTZ CRYSTAL RESONATOR

BACKGROUND OF THE INVENTION

1. Field of the Invention

The present invention relates to a manufacturing method of a tuning-fork type quartz crystal resonator. More particularly, it relates to a manufacturing method of a tuning-fork type quartz crystal resonator, in which short-circuit of an electrode at a crotch portion is eliminated, and yield can be improved.

2. Description of the Related Art

A general constitution of a tuning-fork type quartz crystal resonator will be described with reference to FIG. 3. FIG. 3 is a schematic constitution diagram of the general tuning-fork type quartz crystal resonator.

As shown in FIG. 3, the general tuning-fork type quartz crystal resonator is formed by cutting out a single crystal of a quartz crystal, and constituted of a base portion 10 and two arm portions 11 and 12 protruding from the base portion 10.

Moreover, electrodes 13 and 14 formed of metal films are formed on a front surface portion and a back surface portion of the base portion 10. Here, the only front surface portion is shown, but the back surface portion is similarly formed.

Groove portions are formed in portions close to the base portion 10 at the front surface portion and the back surface portion of a quartz crystal 17 of the arm portion 11, and electrodes 15 formed of a metal film are disposed at the groove portions.

Similarly, groove portions and electrodes 16 are formed at the front surface portion and the back surface portion of a quartz crystal 18 of the arm portion 12. The electrodes 15 and 16 are also formed at outer surface portions and inner surface portions of the arm portions 11, 12.

In this manner, since the groove portions are disposed at the front surface portions and the back surface portions of the arm portions 11 and 12, the arm portions 11 and 12 have substantially H-shaped sections (not shown).

Furthermore, weight films 19 formed of metal films are disposed at the front surface portion and the back surface portion of the quartz crystal 17 at an end portion of the arm portion 11 on a side opposite to the base portion 10. Similarly, weight films 20 are disposed at the front surface portion and the back surface portion of the quartz crystal 18 of the arm portion 12.

Moreover, when a voltage is applied to the tuning-fork type quartz crystal resonator via the electrodes 13 and 14 of the base portion, the arm portions 11 and 12 vibrate to oscillate a predetermined frequency of, for example, 32.768 kHz.

However, with miniaturization of the tuning-fork type quartz crystal resonator, a short-circuit defect is easily generated in root portions of the arm portions 11 and 12.

The short-circuit defect will specifically be described with reference to FIG. 4. FIG. 4 is a schematic sectional explanatory view of a case where the short-circuit defect is generated at the A-A' portion of FIG. 3.

As shown in FIG. 4, at the root portion (a crotch portion 30) of the arm portions 11 and 12, the arm portions 11 and 12 are formed from the base portion 10. Moreover, the electrode 15 is disposed at the inner surface portion of the arm portion 11, and the electrode 16 is formed at the inner surface portion of the arm portion 12.

In the tuning-fork type quartz crystal resonator, patterning is generally performed at a front and a back of a quartz crystal substrate by use of the same electrode and wiring line outer patterns, and electrode arrangements intersect with each other at the crotch portion 30. Therefore, the pattern at the crotch portion 30 becomes very complicated. It is to be noted that FIG. 4 is simplified in order to simplify description thereof.

Steps of forming the conventional electrodes 15 and 16 will briefly be described.

First, the quartz crystal substrate is processed into a tuning-fork form by machine processing and photography/etching, the groove portions of the arm portions 11 and 12 are further formed, and then the metal films constituting the electrodes are formed by vacuum evaporation or sputtering.

Then, after resists applied onto the metal films are exposed and developed into desired patterns by the photolithography, the metal films are patterned using the resist patterns as masks by etching. Afterward, the resists are peeled to form the electrodes 15 and 16. In the conventional manufacturing method of the tuning-fork type quartz crystal resonator, the electrodes 15 and 16 are formed in this manner.

In addition, since a crotch portion 30 part is a small area nipped between the arm portions 11 and 12 and further the pattern is complicated as described above, the exposure and development of the resist easily become insufficient as compared with another area (easily under-exposed and under-developed). Similarly, the metal films are easily under-etched.

Therefore, as shown in FIG. 4, a non-etched metal film portion 31 is easily generated at the crotch portion 30, and short-circuit occurs between the electrodes 15 and 16.

It is to be noted that examples of prior arts concerning the tuning-fork type quartz crystal resonator include Japanese Patent Application Laid-Open Nos. 2001-085963 (Patent Document 1), 08-139337 (Patent Document 2), 2003-133875 (Patent Document 3) and 2005-134364 (Patent Document 4).

In Patent Document 1, a constitution is described in which trim processing of irradiating the center of an arm portion with laser of 700 nm or less to remove a metal coating film is performed to regulate a frequency in the manufacturing method of a tuning-fork type quartz crystal resonator.

Especially, it is determined in Patent Document 1 that in a state in which individual piezoelectric vibration pieces (quartz crystal resonator elements) cut from a quartz crystal wafer are packaged in a sealed manner, a metal coating film portion is irradiated with laser light from a processing device to evaporate and remove a metal.

Moreover, in Patent Document 2, there is described a constitution including the steps of forming a metal coating film for forming silicide, selectively reacting the metal coating film with an active layer to selectively form a silicide area in the active layer, and removing a non-reacted metal coating film in a preparing method of a semiconductor device.

In Patent Document 3, a constitution is described in which a metal coating film is irradiated with laser to form a pattern of a photo mask corresponding to the film in a manufacturing method of a tuning-fork type quartz crystal resonator, and in Patent Document 4, a constitution is described in which a dividing portion of an arm is irradiated with laser to remove the metal coating film in the manufacturing method of the tuning-fork type quartz crystal resonator.

However, the conventional manufacturing method of the tuning-fork type quartz crystal resonator has a problem that the short-circuit defect is easily generated at the crotch portion corresponding to a root of the arm portion.

Moreover, to prevent the short-circuit, process precision needs to be improved, and there has been a problem that manufacturing costs increase.

SUMMARY OF THE INVENTION

The present invention has been developed in view of the above-mentioned situation, and an object thereof is to provide a manufacturing method of a tuning-fork type quartz crystal resonator, in which a simple step is only added to the existing manufacturing process, so that generation of short-circuit at a crotch portion can be prevented and yield can largely be improved.

To solve the above-mentioned problems of the conventional examples, according to the present invention, there is provided a manufacturing method of a tuning-fork type quartz crystal resonator including a base portion and arm portions formed so as to protrude from the base portion, the method comprising: a step of irradiating a crotch portion corresponding to a root portion of the arm portions with laser after forming a metal electrode pattern, so that a non-etched metal film portion at the crotch portion can be removed with the laser, a short-circuit defect between electrodes at the crotch portion can be prevented, and yield can be improved.

Moreover, according to the present invention, in the manufacturing method of the tuning-fork type quartz crystal resonator, the laser irradiation is performed so as to shave a part of the base portion at the center of the crotch portion. Therefore, in the manufacturing method of the tuning-fork type quartz crystal resonator, the non-etched portion can securely be removed. Moreover, a laser irradiation trace is formed at the tuning-fork type quartz crystal resonator, whereby the tuning-fork type quartz crystal resonator treated by the present method can be identified.

Furthermore, according to the present invention, in the manufacturing method of the tuning-fork type quartz crystal resonator, in a state in which a plurality of tuning-fork type quartz crystal resonators are arranged in a quartz crystal wafer surface, the plurality of arranged tuning-fork type quartz crystal resonators are irradiated with the laser from a direction substantially vertical to the quartz crystal wafer surface. Therefore, in the manufacturing method of the tuning-fork type quartz crystal resonator, the laser irradiation can efficiently be performed in a wafer process, and the short-circuit defect at the crotch portion can be prevented and the yield can be improved without largely changing a conventional process or improving process precision.

BRIEF DESCRIPTION OF THE DRAWINGS

FIG. 1A is a schematic explanatory view showing a crotch portion before irradiated with laser, and FIG. 1B is a schematic explanatory view showing the crotch portion irradiated with the laser;

DESCRIPTION OF REFERENCE NUMERALS

10 . . . a base portion, 11, 12 . . . arm portions, 13, 14 . . . electrodes, 15, 16 . . . electrodes, 17, 18 . . . quartz crystals, 19, 20 . . . weight films, 30 . . . a crotch portion, 31 . . . a non-etched portion, and 32 . . . a laser irradiation trace.

DESCRIPTION OF THE PREFERRED EMBODIMENT

An embodiment of the present invention will be described with reference to the drawings.

A manufacturing method of a tuning-fork type quartz crystal resonator according to the embodiment of the present invention is a manufacturing method of a tuning-fork type quartz crystal resonator including a base portion and two arm portions protruding from the base portion, in which a metal film is formed, a metal electrode pattern is formed by photolithography/etching, and a crotch portion corresponding to a root of the arm portions is irradiated with laser. Even when a non-etched metal film portion is left at the crotch portion, a residual metal film can be evaporated and removed by the laser irradiation, and short-circuit between electrodes can be prevented.

Moreover, in the manufacturing method of the tuning-fork type quartz crystal resonator according to the embodiment of the present invention, in a wafer process, crotch portions of a plurality of tuning-fork type quartz crystal resonators arranged on a quartz crystal wafer are irradiated with the laser. A laser irradiation step is just added to the existing steps, so that a short-circuit defect at the crotch portion is eliminated without largely changing the process, and yield can be improved.

Figure 1A:
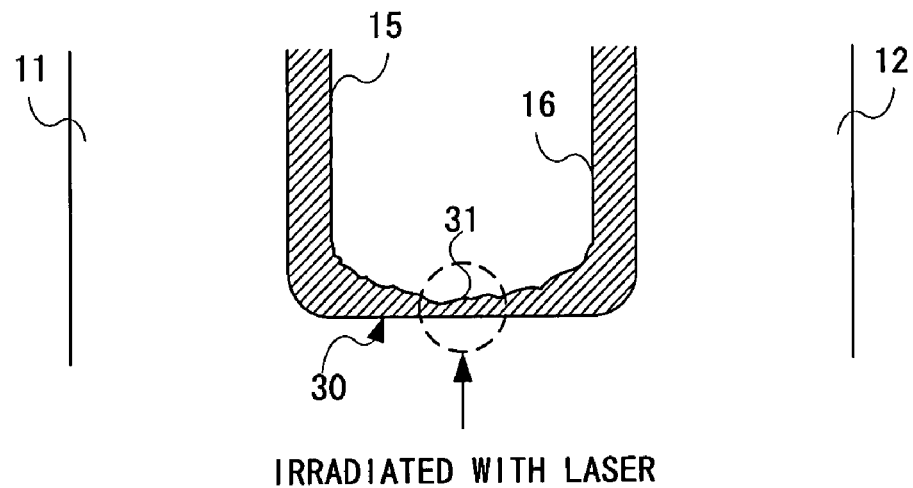
FIGS. 1A and 1B are explanatory views showing a characteristic of a manufacturing method of a tuning-fork type quartz crystal resonator according to an embodiment of the present invention.
Figure 1B:
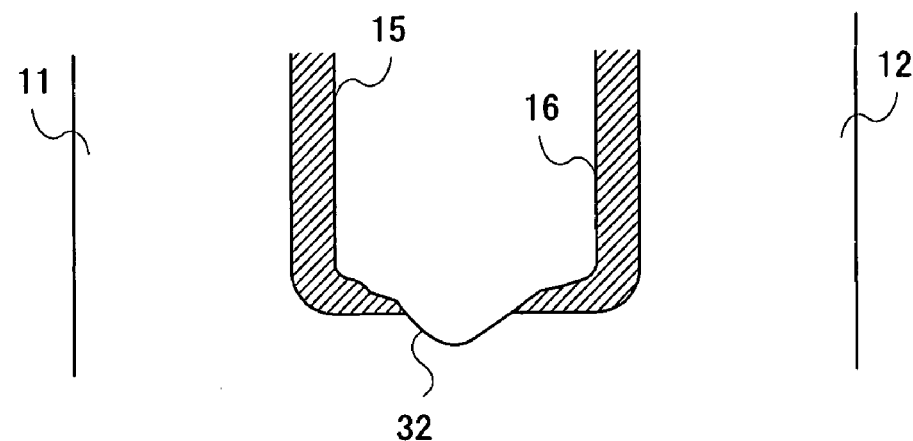
Figure 2:
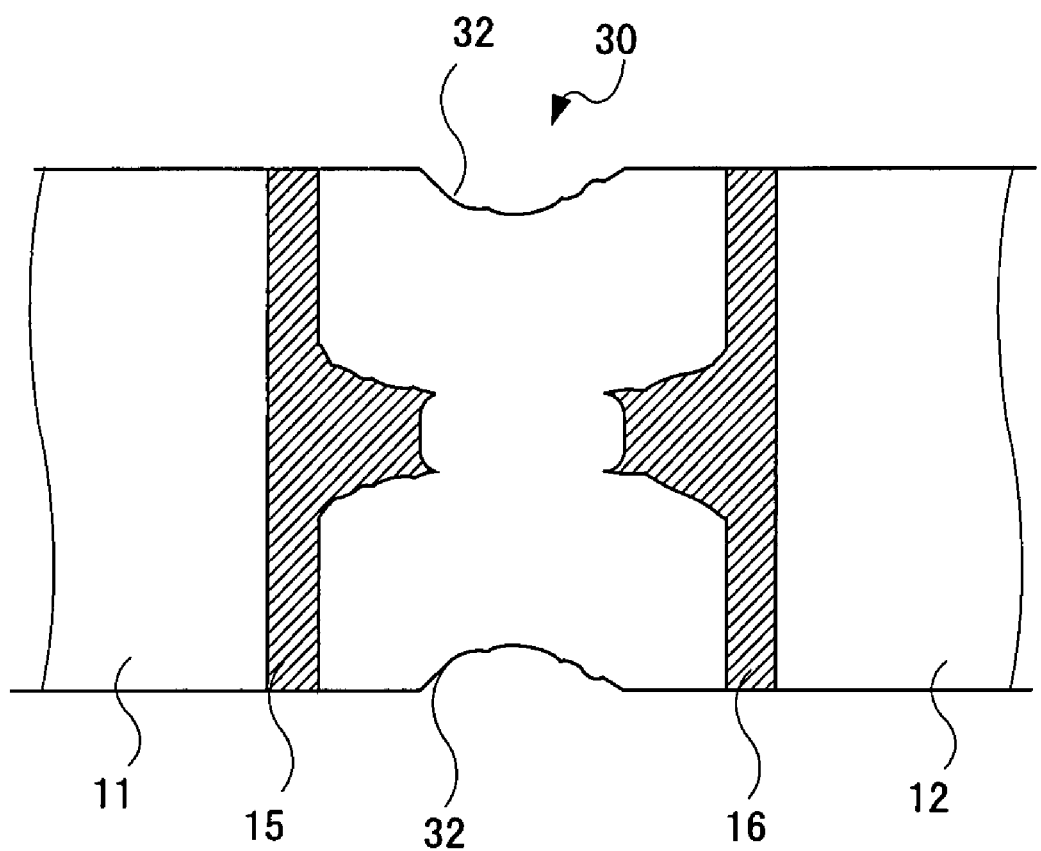
FIG. 2 is a schematic sectional explanatory view of the crotch portion irradiated with the laser.
Figure 3:
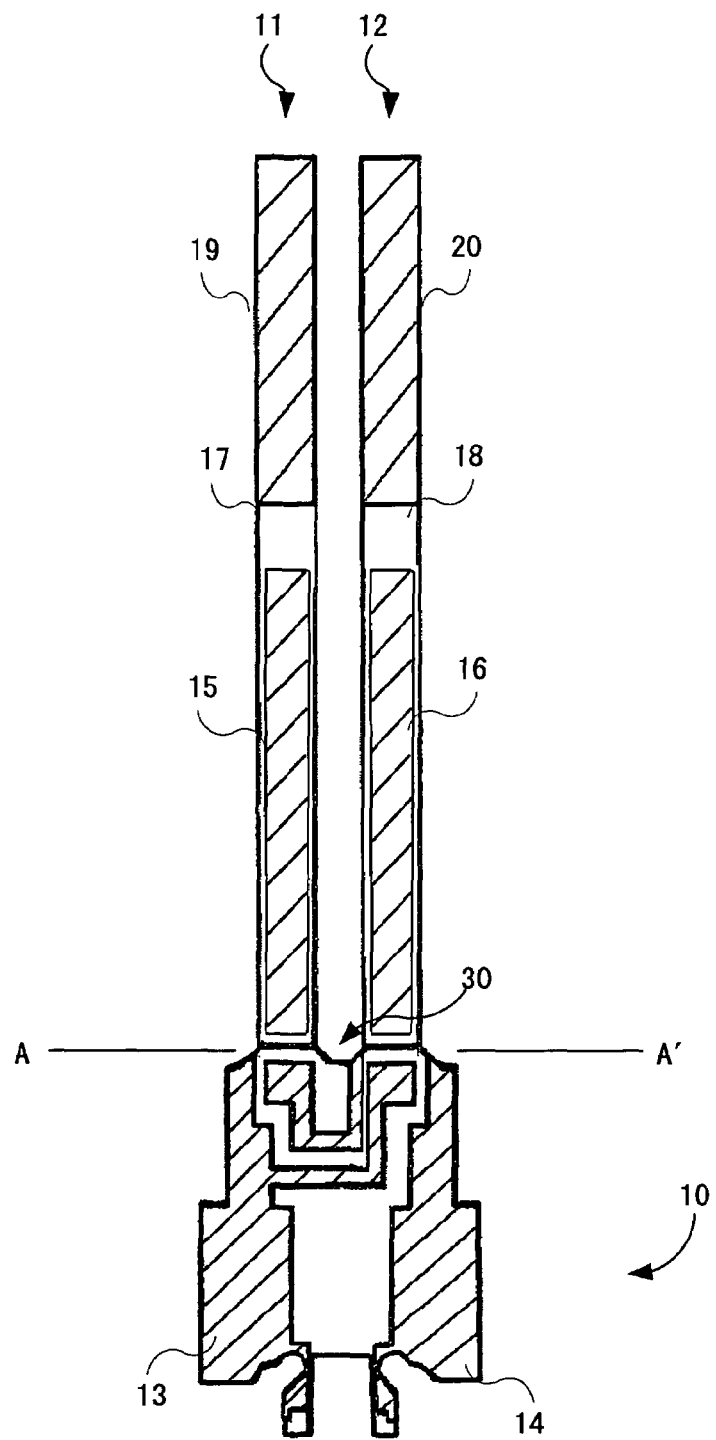
FIG. 3 is a schematic constitution diagram of a general tuning-fork type quartz crystal resonator.
Figure 4:
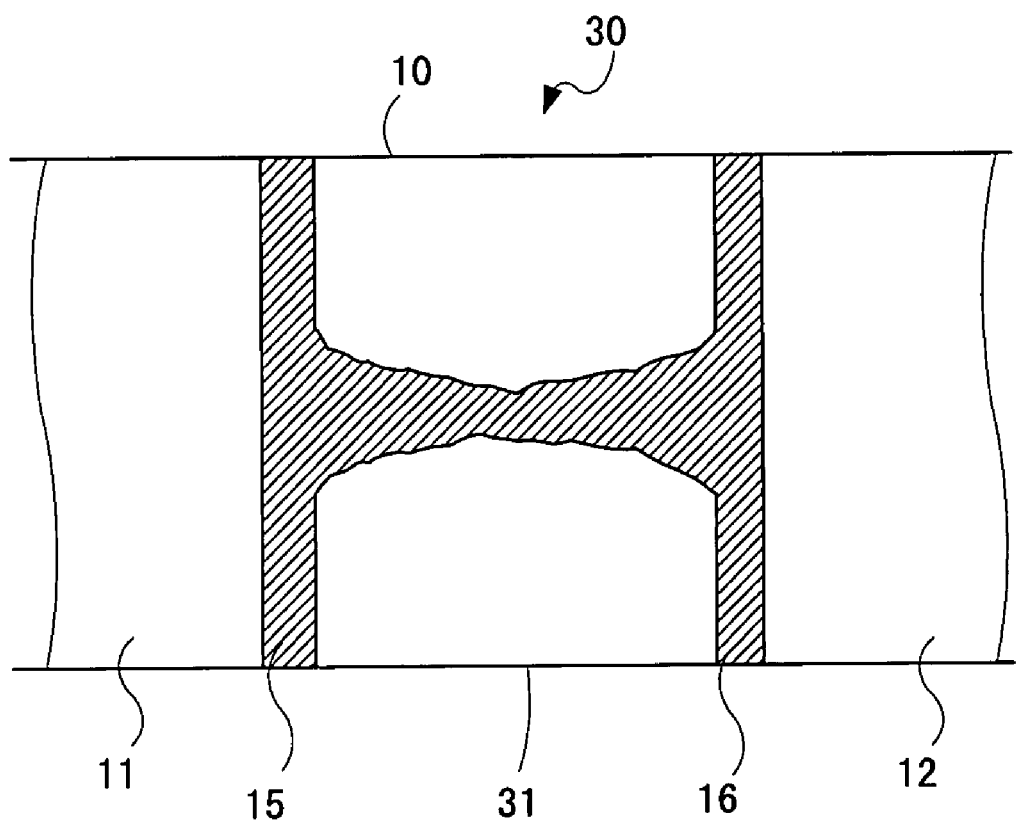
FIG. 4 is a schematic sectional explanatory view of a case where a short-circuit defect is generated at the A-A' portion of FIG. 3.

FIGS. 1A and 1B are explanatory view showing a characteristic of a manufacturing method (the present method) of a tuning-fork type quartz crystal oscillator according to the embodiment of the present invention, FIG. 1A is a schematic explanatory view showing the crotch portion before irradiated with the laser, and FIG. 1B is a schematic explanatory view showing the crotch portion irradiated with the laser. FIG. 2 is a schematic sectional explanatory view of the crotch portion irradiated with the laser. It is to be noted that a part having a constitution similar to that shown in FIGS. 3, 4 is denoted with the same reference numerals for description.

As shown in FIG. 1, in the manufacturing method of the tuning-fork type quartz crystal resonator according to the present embodiment, treatments are performed so that metal films constituting a metal wiring line material and an electrode material are formed on opposite surfaces of a quartz crystal substrate processed into a tuning-fork form, the metal films are patterned to form wiring line patterns on the opposite surfaces of the quartz crystal substrate, and a crotch portion 30 corresponding to a root of arm portions 11, 12 is irradiated with laser light.

The present method will specifically be described.

First, a Z-cut quartz crystal plate (thickness: 100 μm to 150 μm) is processed into a tuning-fork form including a base portion 10 and two arm portions 11, 12. In the processing, technologies of machine processing and a combination of photolithography and etching are used. Furthermore, groove portions of the arm portions 11, 12 are formed by the machine processing or the photolithography/etching.

Subsequently, the metal films are formed on the opposite surfaces of the quartz crystal substrate formed into the tuning-fork form by evaporation or sputtering. As the metal film, for example, a metal film is formed in which two layers are formed using chromium (Cr) having a close contact property with a quartz crystal in a lower layer and using gold (Au) in an upper layer.

Then, the upper layer of the metal film is coated with a photosensitive resist, and the metal film is patterned into a desired electrode or wiring line shape by the photolithography/etching. At this time, in the present method, since a non-etched portion of the crotch portion 30 is removed later by laser irradiation, precision of the process in the photolithography and the etching may have the same degree as that of the conventional process, and a patterning step can be performed in the same manner as in the conventional process.

Then, after the resist is peeled, as a characteristic of the present method, the crotch portion 30 is irradiated with the laser.

In consequence, even when a non-etched portion 31 is generated as shown in FIG. 4, the metal film remaining at the crotch portion 30 can be evaporated and removed as shown in FIG. 2, and short-circuit between electrodes 15 and 16 can be prevented with the process precision of the same degree as that of the conventional method.

Another manufacturing step is similar to that of the conventional method.

Especially, as the characteristic of the present method, as shown in FIGS. 1A and 1B, a position to be irradiated with the laser is the vicinity of the center of the crotch portion 30. The crotch portion is not irradiated so as to strike the laser on the residual metal 31, and the base portion 10 around the residual metal is also irradiated to securely remove the residual metal.

The crotch portion is irradiated so as to also strike the laser on the base portion 10 in this manner, whereby not only the residual metal film but also a part of the base portion 10 around the crotch portion 30 shown in FIG. 1B are shaved by the laser, and bored-portion-like laser irradiation traces 32 are formed. That is, the tuning-fork type quartz crystal resonator having the laser irradiation traces 32 at the base portion 10 of the crotch portion 30 can be regarded as manufactured by the present method.

Next, a wafer process will be described. To manufacture the tuning-fork type quartz crystal resonator, a plurality of tuning-fork type quartz crystal resonators are collectively manufactured on the quartz crystal wafer. In a state in which a plurality of quartz crystal pieces cut out into tuning-fork forms are arranged on the quartz crystal wafer, a metal film is formed, metal electrode and wiring line patterns are formed by photolithography and etching, and the individual tuning-fork type quartz crystal resonators are cut from the quartz crystal wafer.

Then, as described above, in the present method, a treatment of the laser irradiation is performed in a wafer process before the individual tuning-fork type quartz crystal resonators are cut and separated from the quartz crystal wafer. During the laser irradiation, a wafer surface is irradiated at an angle substantially vertical to the surface. In consequence, the crotch portions 30 of the plurality of tuning-fork type quartz crystal resonators arranged at specific intervals on the wafer can successively be irradiated with the laser, alignment during the laser irradiation is facilitated, and the treatment can quickly be performed.

That is, in the present method, all the tuning-fork type quartz crystal resonators in the same quartz crystal wafer surface are similarly treated with the laser irradiation, and in actual, necessity of the irradiation is not determined by judging whether or not there is short-circuit in the individual tuning-fork type quartz crystal resonators.

In consequence, the treatment of the laser irradiation can quickly be performed.

As described above, in the present method, since all the vibrators are subjected to the same laser irradiation in the wafer process, the non-etched portions need to be securely removed, and it is necessary to select a wave length and a light diameter to such an extent that even in a case where the base portion 10 which does not have any non-etched portion is irradiated, operation characteristics of a vibrator are not influenced.

In the present method, as the laser light, for example, yttrium aluminum garnet (YAG) laser (wavelength of 1064 nm), yttrium vanadate (YVO4) laser (wavelength of 1047 nm, 1053 nm), or lithium yttrium fluoride (YLF) laser (wavelength of 1064 nm) can be used. Another laser light may be used, but it is preferable that the wavelength is 1065 nm or less.

It is preferable to set the light diameter of the laser light to 5 to 90 µm so that a micro tuning-fork type quartz crystal resonator is irradiated to securely remove the non-etched portion of the metal film and so that an operation of the tuning-fork type quartz crystal resonator is not influenced.

A type and the light diameter of the laser can appropriately be selected in accordance with a shape and a size of the tuning-fork type quartz crystal resonator.

According to the manufacturing method of the tuning-fork type quartz crystal resonator of the embodiment of the present invention, the metal film is formed on the quartz crystal substrate processed into the tuning-fork form by evaporation or sputtering, the metal film is patterned into desired electrode and wiring line shapes by the photolithography/etching, and the crotch portion 30 is then subjected to the treatment of the laser irradiation. Therefore, effects can be produced that even when the crotch portion 30 has the non-etched portion of the metal film, the residual metal film can be removed by the laser irradiation, the short-circuit defect between the electrodes at the crotch portion 30 can be eliminated, and the yield can be improved.

Moreover, according to the present method, since the laser irradiation is performed in the wafer process before the tuning-fork type quartz crystal resonator is cut and separated from the quartz crystal wafer, the step of the laser irradiation may only be inserted into the conventional manufacturing steps, process precision does not have to be improved, and there is an effect that the short-circuit defect can be eliminated and the yield can be improved without largely changing the process.

Furthermore, according to the present method, the wafer surface is irradiated with the laser from a direction substantially crossing the wafer surface at right angles so that a part of the base portion 10 of the crotch portion 30 is shaved. Therefore, the non-etched portion 31 can securely be removed. Moreover, even after the manufacturing, the laser irradiation traces 32 bored with the laser are left at the crotch portion 30, whereby there is an effect that the tuning-fork type quartz crystal resonator treated by the present method can be identified.

In addition, the tuning-fork type quartz crystal resonator manufactured by the present method can be stored in a ceramic package to manufacture a quartz crystal resonator. Moreover, the quartz crystal resonator using the present vibrator may be combined with an oscillation circuit including an amplification circuit and the like, and stored in a package to manufacture a quartz crystal oscillator.

The present invention is suitable for a manufacturing method of a tuning-fork type quartz crystal resonator, in which short-circuit between electrodes at a crotch portion can be eliminated to improve yield.

What is claimed is:

1. A manufacturing method of a tuning-fork type quartz crystal resonator including a base portion and arm portions formed so as to protrude from the base portion, the method comprising:

a step of irradiating a crotch portion corresponding to a root portion of the arm portions with laser after forming a metal electrode pattern.

2. The manufacturing method of the tuning-fork type quartz crystal resonator according to claim 1, wherein the laser irradiation is performed so as to shave a part of the base portion at the center of the crotch portion.

3. The manufacturing method of the tuning-fork type quartz crystal resonator according to claim 2, wherein in a state in which a plurality of tuning-fork type quartz crystal resonators are arranged in a quartz crystal wafer surface, the plurality of arranged tuning-fork type quartz crystal resonators are irradiated with the laser from a direction substantially vertical to the quartz crystal wafer surface.

4. The manufacturing method of the tuning-fork type quartz crystal resonator according to claim 2, wherein a wavelength of the irradiation laser is 1064 nm or less.

5. The manufacturing method of the tuning-fork type quartz crystal resonator according to claim 2, wherein a light diameter of the irradiation laser is 5 μm or more and less than 90 μm.

6. The manufacturing method of the tuning-fork type quartz crystal resonator according to claim 2, wherein the irradiation laser is laser produced by one of YAG, YVO4 and YLF.

7. The manufacturing method of the tuning-fork type quartz crystal resonator according to claim 1, wherein in a state in which a plurality of tuning-fork type quartz crystal resonators are arranged in a quartz crystal wafer surface, the plurality of arranged tuning-fork type quartz crystal resonators are irradiated with the laser from a direction substantially vertical to the quartz crystal wafer surface.

8. The manufacturing method of the tuning-fork type quartz crystal resonator according to claim 7, wherein a wavelength of the irradiation laser is 1064 nm or less.

9. The manufacturing method of the tuning-fork type quartz crystal resonator according to claim 7, wherein a light diameter of the irradiation laser is 5 μm or more and less than 90 μm.

10. The manufacturing method of the tuning-fork type quartz crystal resonator according to claim 7, wherein the irradiation laser is laser produced by one of YAG, YVO4 and YLF.

11. The manufacturing method of the tuning-fork type quartz crystal resonator according to claim 1, wherein a wavelength of the irradiation laser is 1064 nm or less.

12. The manufacturing method of the tuning-fork type quartz crystal resonator according to claim 11, wherein a light diameter of the irradiation laser is 5 μm or more and less than 90 μm.

13. The manufacturing method of the tuning-fork type quartz crystal resonator according to a claim 11, wherein the irradiation laser is laser produced by one of YAG, YVO4 and YLF.

14. The manufacturing method of the tuning-fork type quartz crystal resonator according to claim 1, wherein a light diameter of the irradiation laser is 5 μm or more and less than 90 μm.

15. The manufacturing method of the tuning-fork type quartz crystal resonator according to claim 14, wherein the irradiation laser is laser produced by one of YAG, YVO4 and YLF.

16. The manufacturing method of the tuning-fork type quartz crystal resonator according to claim 1, wherein the irradiation laser is laser produced by one of YAG, YVO4 and YLF.

* * * * *